(12) United States Patent
Eger et al.

(10) Patent No.: US 8,222,859 B2
(45) Date of Patent: Jul. 17, 2012

(54) METHOD FOR DETERMINING THE CHARGE STATE OF A MOTOR VEHICLE BATTERY WHEN THE DRIVE UNIT IS SWITCHED OFF

(75) Inventors: Ulrich Eger, Zaberfeld (DE); Alexander Dyck, Pirmasens (DE); Sargon Youssef, St. Ingbert (DE)

(73) Assignee: Dr. Ing. h.c.F. Porsche Aktiengesellschaft (DE)

( * ) Notice: Subject to any disclaimer, the term of this patent is extended or adjusted under 35 U.S.C. 154(b) by 408 days.

(21) Appl. No.: 12/575,941

(22) Filed: Oct. 8, 2009

(65) Prior Publication Data

US 2010/0090660 A1 Apr. 15, 2010

(30) Foreign Application Priority Data

Oct. 13, 2008 (DE) .......................... 10 2008 051 033

(51) Int. Cl.
 *H01M 10/44* (2006.01)
 *H01M 10/46* (2006.01)
(52) U.S. Cl. ....................................................... 320/104
(58) Field of Classification Search .................. 320/104, 320/107, 112, 115, 150
 See application file for complete search history.

(56) References Cited

U.S. PATENT DOCUMENTS

| 5,929,609 | A | * | 7/1999 | Joy et al. ........................... 322/25 |
| 7,425,814 | B2 | | 9/2008 | Tsuchiya et al. |
| 2002/0113441 | A1 | * | 8/2002 | Obayashi ..................... 290/40 C |
| 2003/0015874 | A1 | * | 1/2003 | Abe et al. ..................... 290/40 C |
| 2005/0231169 | A1 | * | 10/2005 | Seo et al. ....................... 320/150 |
| 2006/0202666 | A1 | * | 9/2006 | Laig-Hoerstebrock et al. ............................ 320/150 |

FOREIGN PATENT DOCUMENTS

DE 10134065 1/2003
DE 102005004998 8/2006

* cited by examiner

*Primary Examiner* — Edward Tso
(74) *Attorney, Agent, or Firm* — Gerald E. Hespos; Michael J. Porco

(57) ABSTRACT

A method is provided for determining the charge state of a motor vehicle battery. An electrical voltage of the motor vehicle battery is detected and the electrical charge state of the motor vehicle battery is determined on the basis of the detected voltage of the motor vehicle battery. According to the method, the temperature of the motor vehicle battery is detected using a sensor that is separated spatially from the motor vehicle battery, and the charge state of the battery is determined on the basis of the detected voltage of the motor vehicle battery and on the basis of the detected temperature of the motor vehicle battery.

18 Claims, 1 Drawing Sheet

METHOD FOR DETERMINING THE CHARGE STATE OF A MOTOR VEHICLE BATTERY WHEN THE DRIVE UNIT IS SWITCHED OFF

CROSS-REFERENCE TO RELATED APPLICATIONS

This application claims priority under 35 USC 119 to German Patent Application No. 10 2008 051 033.5 filed on Oct. 13, 2008, the entire disclosure of which is incorporated herein by reference.

BACKGROUND OF THE INVENTION

1. Field of the Invention

The invention relates to a method for determining the charge state of a motor vehicle battery.

2. Description of the Related Art

A large number of electrical loads are installed in a motor vehicle and they consume electrical power even when the drive unit of the motor vehicle is switched off. These electrical loads include, for example, an anti-theft system or a GPS system of the motor vehicle. The drive unit of the motor vehicle cannot charge the motor vehicle battery when the drive unit is switched off. As a result, the motor vehicle battery of the motor vehicle is discharged when the drive unit is switched off. The discharge of the motor vehicle battery can deactivate the electrical loads of the motor vehicle if a motor vehicle has not been moved for a relatively long period of time. Thus, for example, an anti-theft system of the motor vehicle may no longer be active. In an extreme case, a starter battery of the motor vehicle may even be discharged so that the drive unit of the motor vehicle then can be started only using an external starting aid.

It is already known from practice to connect a battery-charging device to the on-board electrical system of the motor vehicle to counteract such discharging of the motor vehicle battery and deactivation of electrical loads that take up electrical power even when the drive unit is switched off. The battery-charging device can be used to compensate for the power drain of electrical loads and to maintain the motor vehicle battery at a charge state at which the electrical loads which are active even when the drive unit is switched off can be operated reliably.

Battery-charging devices that do not require an electrical mains supply have to be used if an electrical mains supply is not available for operating a battery-charging device. Battery-charging devices that do not require an electrical mains supply may be, for example, a fuel cell battery-charging device.

A battery-charging device that is independent of a mains supply must be used only to charge the motor vehicle battery when it is absolutely necessary due to the charge state of the motor vehicle battery to ensure that the battery-charging device is available for a long time or has a long service life. Accordingly, knowledge of the electrical charge state of the motor vehicle battery of a motor vehicle is of decisive importance for the control of a battery-charging device that is independent of the mains supply.

It is known from practice to determine the electrical charge state of a motor vehicle battery of a motor vehicle on the basis of a voltage of the motor vehicle battery, which is detected by means of measuring technology. However, this only permits relatively inaccurate determination of the electrical charge state of the motor vehicle battery.

Taking this as a basis, the present invention is based on the problem of providing a novel method for determining the charge state of a motor vehicle battery, which method can be used to determine the charge state with a relatively high level of accuracy.

SUMMARY OF THE INVENTION

According to the invention, the temperature of the motor vehicle battery is detected using a sensor that is spatially separated from the motor vehicle battery. The charge state of the battery is determined on the basis of the detected voltage of the motor vehicle battery and on the basis of the detected temperature of the motor vehicle battery.

The invention detects the temperature of the motor vehicle battery using a sensor that is spatially separated from the motor vehicle battery, and accordingly is external to the motor vehicle battery. The invention then determines the electrical charge state of the motor vehicle battery on the basis of the detected electrical voltage and on also the basis of the detected temperature.

This permits substantially more accurate determination of the electrical charge state of the motor vehicle battery, with the temperature of the motor vehicle battery being detected externally to the motor vehicle battery. Accordingly, a control device of an on-board electrical system of the motor vehicle need not be switched on or activated for the inventive detection of the electrical charge state of a motor vehicle battery.

Exemplary embodiments of the invention will be explained in more detail with reference to the drawings, without the invention being restricted to the exemplary embodiments.

DETAILED DESCRIPTION OF THE PREFERRED EMBODIMENT

Figure 1:
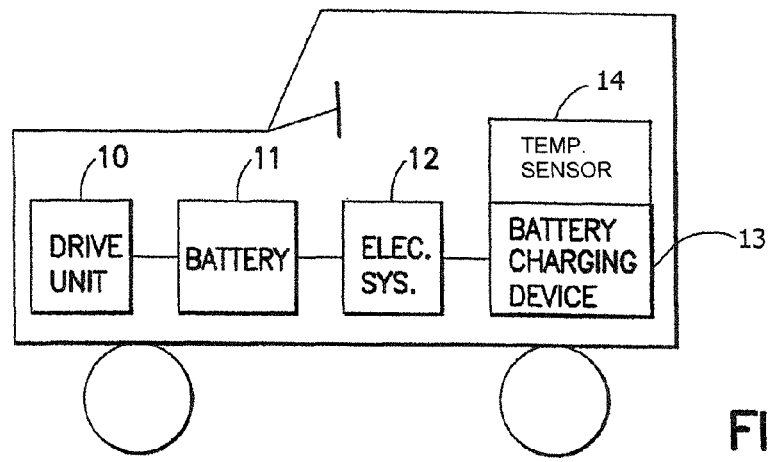
FIG. 1 is a perspective view of a motor vehicle clarifying the method of the invention for determining the charge state of a motor vehicle battery.

FIG. 1 is a highly schematic view of a motor vehicle with a drive unit 10, a motor vehicle battery 11 and an on-board electrical system 12. The motor vehicle battery 11 can be charged by the drive unit 10 when the drive unit 10 is running. On the other hand, the motor vehicle battery 11 cannot be charged by the drive unit 10 when the drive unit 10 is switched off. However, a number of electrical loads of the motor vehicle, such as an anti-theft system, consume electrical power even when the drive unit 10 is switched off, and hence the electrical charge state of the motor vehicle battery 11 is reduced when the drive unit 10 is switched off.

According to FIG. 1, a battery-charging device 13 is connected to the on-board electrical system 12 of the motor vehicle. The battery-charging device 13 is independent of the electrical mains supply, for example, may be a fuel cell battery-charging device.

The battery-charging device 13 is intended to be activated to charge the motor vehicle battery 11 when the electrical charge state of the motor vehicle battery 11 drops below a defined limiting value. On the other hand, the battery-charging device 13 will not be activated and will be switched off when the charge state of the motor vehicle battery 11 is greater than this defined limiting value, thereby ensuring that the battery-charging device 13 has a service life that is as long as possible.

The battery-charging device 13, which is independent of the electrical mains supply, can be connected to the on-board electrical system 12 of the motor vehicle via an on-board electrical system socket of said motor vehicle.

The determination of the electrical charge state of the motor vehicle battery 11 of the motor vehicle is carried out on the basis of a detected electrical voltage of the motor vehicle battery 11 and also on the basis of a detected temperature of the motor vehicle battery 11. The temperature of the motor vehicle battery 11 is detected using a sensor 14 that is separated spatially from the motor vehicle battery 11, external to the motor vehicle battery and preferably a component of the battery-charging device 13. The electrical charge state of the motor vehicle battery 11 is determined as a function of the detected electrical voltage and the detected temperature of said motor vehicle battery 11.

Details of the method of the invention for determining the electrical charge state of the motor vehicle battery 11 are described below with reference to the signal flowchart in FIG. 2.

In a first step 20, the method checks whether conditions for determining the electrical charge state of the motor vehicle battery 11 are met. The inventive determination of the electrical charge state of the motor vehicle battery 11 therefore takes place only when the drive unit 10 of the motor vehicle is switched off. Furthermore, when the drive unit 10 is switched off, the inventive determination of the electrical charge state of the motor vehicle battery takes place only at defined time intervals of, for example, 24 hours or 48 hours since, when the drive unit 10 is switched off, the charge state of the motor vehicle battery 11 changes only slowly and therefore it is not necessary to determine the electrical charge state of the motor vehicle battery 11 at short intervals.

The defined time intervals in which the charge state of the motor vehicle battery 11 is determined can be predefined permanently or else can be variable or dynamic. It is therefore possible to provide that the time intervals are dependent on the charge state of the motor vehicle battery 11, with the time intervals being longer at higher charge states.

The time intervals may be dependent on temperature differences between a day-time temperature and a night-time temperature, with the time intervals being longer when there are smaller differences between the day-time temperature and the night-time temperature.

The method branches from step 20 to step 21 if the defined conditions for the inventive determination of the electrical charge state of the motor vehicle battery 11 are met in block 20. On the other hand, the method branches back to step 20 in the manner of a loop if the defined conditions for the inventive determination of the electrical charge state of the motor vehicle battery 11 are not met in step 20.

Figure 2:
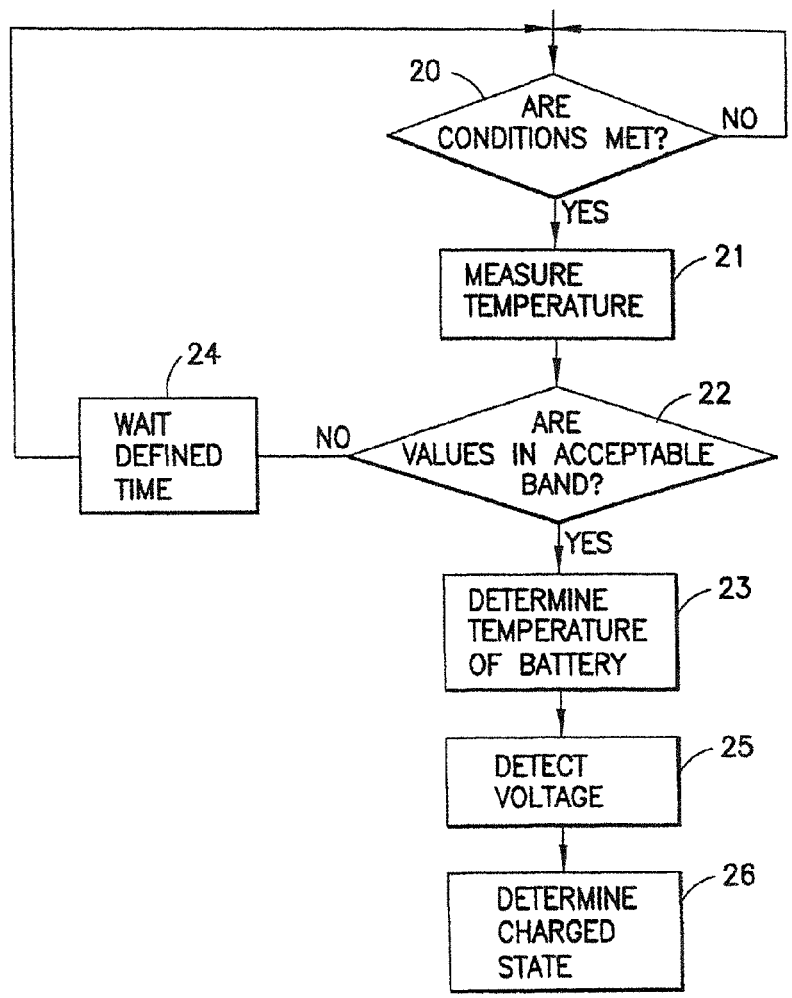
FIG. 2 is a signal flowchart further clarifying the method of the invention for determining the charge state of a motor vehicle battery.

Temperature values are determined in a plurality of successive measurements in step 21 of the signal flowchart in FIG. 2 using the sensor that is external to the motor vehicle battery and that is a component of the battery-charging device 13 in the illustrated exemplary embodiment. In step 22, the method checks whether the detected temperature values differ from one another within a permissible tolerance band.

The method infers that steady-state conditions apply if it is detected in step 22 that the temperature values detected in step 21 differ from one another within the permissible tolerance band, and the system branches to step 23. A temperature value measured by the sensor in step 23 then is determined as a temperature of the motor vehicle battery.

It is also possible that a mean value of the temperature values that are acquired by means of measuring technology in step 21 then is used as the temperature of the motor vehicle battery 11.

On the other hand, the method assumes that steady-state conditions do not apply if it is determined in step 22 that the temperature values that are detected in step 21 do not differ from one another within the permissible tolerance band. Hence, the method branches from step 22 to step 24, and after the expiration of a defined waiting time, the system branches from step 24 back to step 20.

After the temperature of the motor vehicle battery 11 has been determined in step 23, the electrical voltage of the motor vehicle battery 11 is detected in step 25, preferably using a sensor that is external to the motor vehicle battery and that is a component of the battery-charging device 13. As noted above, the battery-charging device 13 preferably is connected via an on-board electrical system socket to the on-board electrical system 12 of the motor vehicle.

The detection of the electrical voltage of the motor vehicle battery 11 in step 25 can be carried out in coordination with the detection of the temperature of the motor vehicle battery in such a way that a voltage measured value for the electrical voltage of the motor vehicle battery 11 is acquired in each of a plurality of successive measurements. A voltage measured value is determined as the electrical voltage of the motor vehicle battery 11 if the voltage measured values that are detected in the method differ from one another within a permissible tolerance band. The system branches back to step 20 after a defined time period has expired if the detected voltage measured values do not differ from one another within the permissible tolerance band.

The electrical charge state of the motor vehicle battery then is detected in step 26 from the temperature of the motor vehicle battery 11, which is detected in step 23, and the electrical voltage of the motor vehicle battery, which is detected in step 25. The electrical charge state can be determined either by means of a formula or by means of a characteristic diagram.

When the electrical charge state of the motor vehicle battery 11 is detected as a function of the electrical voltage and as a function of the temperature thereof using a characteristic diagram, the characteristic diagram is stored in the battery-charging device 13.

The battery-charging device 13 then detects the electrical charge state of the motor vehicle battery on the basis of the detected electrical voltage and the detected temperature of the motor vehicle battery 11 using the characteristic diagram. The characteristic diagram comprises a plurality of characteristic curves, and, if appropriate, interpolation is carried out within the characteristics curves or between the characteristic curves. Specifically interpolation is carried out if a characteristic curve is not stored for the specifically detected temperature and/or the specifically detected electrical voltage of the motor vehicle battery 11 and/or the characteristic curves for these values do not comprise reference points.

In contrast, the electrical charge state of the motor vehicle battery 11 can be determined by a formula on the basis of the detected electrical voltage of the motor vehicle battery 11 and on the basis of the detected temperature of the motor vehicle battery 11. In this context it is possible, for example, to use the following formula:

$$SOC = -K1*U^2 + U*(K2-(K3*e^{-K4 \cdot T})) - (K5-(K6*e^{-K7 \cdot T}))$$

where SOC is the electrical charge state of the motor vehicle battery, U is the detected electrical voltage of the motor vehicle battery, T is the detected temperature of the motor vehicle battery and K1, K2, K3, K4, K5, K6 and K7 are constants.

The above formula and/or its constants K1 to K7 preferably are configured for an electrical charge state that is to be maintained and/or a battery type. The motor vehicle battery is typically a lead battery.

A formula for determining the electrical charge state of the motor vehicle battery 11 as a function of the electrical voltage U and the temperature thereof is stored in the battery-charging device 13. The constants of the formula typically are dependent on the battery type, but they are determined for the formula in such a way that the charge state of a motor vehicle battery can be detected for all battery types with sufficient accuracy so that ultimately a reliable determination of the charge state of the motor vehicle battery is independent of the battery type specifically installed in the motor vehicle.

The battery-charging device 13 is activated to charge the motor vehicle battery 11 when an electrical charge state of the motor vehicle battery 11 detected in the above manner is lower than a defined limiting value. On the other hand, the battery-charging device 13 is not activated when the determined charge state of the motor vehicle battery is higher than the defined limiting value, and the electrical charge state of the motor vehicle battery 11 is determined again after the expiration of a defined time period.

Accordingly, the invention uses a battery-charging device 13, which comprises a sensor for detecting a temperature of the motor vehicle battery 11 and a sensor for detecting an electrical voltage of the motor vehicle battery 11, to measure the electrical charge state of the motor vehicle battery 11 of the motor vehicle reliably and accurately when the drive unit 10 is switched off and accordingly when the control devices of an on-board electrical system 12 of a motor vehicle is not activated. The electrical charge state of the motor vehicle battery 11 then is detected from the detected electrical voltage and the detected temperature of the motor vehicle battery 11 in a characteristic-diagram-based manner or formula-based manner.

The battery-charging device 13 preferably is positioned in an interior space of the motor vehicle and is connected, for example, to the on-board electrical system 12 of the motor vehicle via an on-board electrical system socket. In this case, given steady-state conditions, it is assumed that the temperature detected by the temperature sensor of the battery-charging device 13 in the interior space of the motor vehicle corresponds to the temperature of the motor vehicle battery 11. However, the battery-charging device 13 does not have to be positioned in the interior space of the motor vehicle. It can also be positioned outside the motor vehicle or in the trunk. The battery-charging device may be mobile or permanently connected to the on-board electrical system.

What is claimed is:

1. A method for determining the charge state of a motor vehicle battery, comprising: detecting an electrical voltage of the motor vehicle battery using a sensor external to the motor vehicle battery for detecting the temperature of the motor vehicle battery at time intervals while a drive unit of the motor vehicle is switched off, and determining the charge state of the battery on the basis of the detected voltage of the motor vehicle battery and on the basis of the detected temperature of the motor vehicle battery.

2. The method of claim 1, wherein the step of using a sensor external to the motor vehicle battery for detecting the temperature of the motor vehicle battery comprises using a sensor assigned to a battery-charging device.

3. The method of claim 2, wherein the battery-charging device is in the interior of the motor vehicle.

4. The method of claim 1, wherein the step of using the sensor for detecting the temperature of the motor vehicle battery comprises using the sensor in a plurality of successive measurements, wherein, a temperature value which is measured by the sensor is determined as a temperature of the motor vehicle battery when the detected temperature values differ from one another within a permissible tolerance band.

5. The method of claim 1, wherein the step of detecting the voltage of the motor vehicle battery comprises using a sensor that is external to the motor vehicle battery and that is assigned to a battery-charging device.

6. The method of claim 5, wherein the battery-charging device is connected to an on-board electrical system of the motor vehicle.

7. The method of claim 1, wherein the electrical voltage of the motor vehicle battery is detected by acquiring a voltage measured value in a plurality of successive measurements, and wherein, a voltage measured value is determined as a voltage of the motor vehicle battery when the voltage measured values differ from one another within a permissible tolerance band.

8. The method of claim 1, wherein the electrical charge state of the motor vehicle battery is determined by means of a formula on the basis of the detected voltage of the motor vehicle battery and on the basis of the detected temperature of the motor vehicle battery.

9. The method of claim 1, wherein the electrical charge state of the motor vehicle battery is determined by a characteristic diagram on the basis of the detected voltage of the motor vehicle battery and on the basis of the detected temperature of the motor vehicle battery.

10. The method of claim 3, further comprising activating the battery-charging device to charge the motor vehicle battery if the charge state of the motor vehicle battery is determined to lower than a defined limiting value.

11. The method of claim 10, wherein, the battery-charging device is not activated if the charge state of the motor vehicle battery is higher than a defined limiting value.

12. A method for determining a charge state of a motor vehicle battery, comprising:
    detecting voltage of the motor vehicle battery;
    using a sensor that is separated spatially from the motor vehicle battery to make a plurality of successive temperature measurements to obtain a plurality of successive detected temperature values;
    determining whether the detected temperature values differ from one another within a permissible tolerance band;
    determining a temperature value measured by the sensor as a temperature of the motor vehicle battery when the detected temperature values differ from one another within the permissible tolerance band; and
    determining the charge state of the battery based on the detected voltage of the motor vehicle battery and on the detected temperature of the motor vehicle battery.

13. The method of claim 12, wherein the step of detecting voltage of the motor vehicle battery comprises detecting the voltage of the motor vehicle battery in a plurality of successive measurements to obtain a voltage measured value, and wherein the method further comprises: determining whether the detected voltage measured values differ from one another within a permissible tolerance band; and determining a measured voltage measured value as a voltage of the motor vehicle battery when the detected voltage measured values differ from one another within a permissible tolerance band.

14. The method of claim 12, wherein the electrical charge state of the motor vehicle battery is determined by a formula on the basis of the detected voltage of the motor vehicle battery and on the basis of the detected temperature of the motor vehicle battery.

15. The method of claim 12, wherein the electrical charge state of the motor vehicle battery is determined by a characteristic diagram on the basis of the detected voltage of the motor vehicle battery and on the basis of the detected temperature of the motor vehicle battery.

16. The method of claim 12, wherein the charge state of the motor vehicle battery is determined at time intervals on a motor vehicle with a switched-off drive unit.

17. The method of claim 12, wherein if the charge state of the motor vehicle battery is lower than a defined limiting value, the battery-charging device is activated to charge the motor vehicle battery.

18. A motor vehicle, comprising:
a drive unit configured to be switched off selectively;
a chargeable battery;
a voltage detector for detecting a voltage of the battery, the voltage detector being independent of an electrical main supply;
a temperature sensor spatially separated from the battery and being independent of the electrical main supply; and
a battery charging device connected to the battery and being independent of the electrical main supply, the battery charging device being configured for charging the battery when a charged state of the battery drops below a predetermined limiting value as determined by the voltage of the battery detected by the voltage detector and the temperature sensed by the temperature sensor and when the drive unit of the motor vehicle is switched off.

* * * * *